(12) United States Patent
Cambonie

(10) Patent No.: US 6,992,502 B2
(45) Date of Patent: Jan. 31, 2006

(54) CONFIGURABLE ELECTRONIC CIRCUIT, IN PARTICULAR ONE DEDICATED TO ARITHMETIC CALCULATIONS

(75) Inventor: Joël Cambonie, La Combe de Lancey (FR)

(73) Assignee: STMicroelectronics SA, Montrouge (FR)

( * ) Notice: Subject to any disclaimer, the term of this patent is extended or adjusted under 35 U.S.C. 154(b) by 145 days.

(21) Appl. No.: 10/768,997

(22) Filed: Jan. 30, 2004

(65) Prior Publication Data

US 2004/0225704 A1    Nov. 11, 2004

(30) Foreign Application Priority Data

Jan. 31, 2003    (FR)    ................................ 03 01137

(51) Int. Cl.
*H03K 19/173*    (2006.01)
(52) U.S. Cl. .......................................... 326/38; 326/41
(58) Field of Classification Search ............ 326/38–41; 708/501–508
See application file for complete search history.

(56) References Cited

U.S. PATENT DOCUMENTS

| | | | |
|---|---|---|---|
| 6,628,140 B2 * | 9/2003 | Langhammer et al. | 326/40 |
| 6,812,738 B1 * | 11/2004 | Dante et al. | 326/41 |
| 6,836,839 B2 * | 12/2004 | Master et al. | 712/29 |
| 6,883,084 B1 * | 4/2005 | Donohoe | 712/1 |
| 2002/0057104 A1 | 5/2002 | New et al. | 326/41 |
| 2005/0144216 A1 * | 6/2005 | Simkins et al. | 708/620 |

FOREIGN PATENT DOCUMENTS

| EP | 0668659 | 8/1995 |
|---|---|---|
| EP | 1191696 | 3/2002 |

\* cited by examiner

*Primary Examiner*—Don P. Le
(74) *Attorney, Agent, or Firm*—Lisa K. Jorgenson; Allen, Dyer, Doppelt, Milbrath & Gilchrist, P.A.

(57) ABSTRACT

A configurable electronic circuit includes at least one tile that includes a plurality of cells interconnected. Each cell includes a multiplier, an arithmetic and logic unit for performing at least one arithmetic and/or logic function from a set of functions, a vertical bus, and a first configurable switching circuit connected to the vertical bus and to inputs of the multiplier. Each cell further includes a second configurable switching circuit connected to the vertical bus and to an output of the multiplier, a third configurable switching circuit connected to the vertical bus and to an output of the multiplier in a different cell, a fourth configurable switching circuit connected to the vertical bus and to inputs of the arithmetic and logic unit, and a fifth configurable switching circuit connected to the vertical bus and to an output of the arithmetic and logic unit.

27 Claims, 9 Drawing Sheets

CONFIGURABLE ELECTRONIC CIRCUIT, IN PARTICULAR ONE DEDICATED TO ARITHMETIC CALCULATIONS

FIELD OF THE INVENTION

The present invention relates to configurable electronic circuits, and in particular, but not limited to, those dedicated to arithmetic calculations.

BACKGROUND OF THE INVENTION

Conventional configurable circuits include Field Programmable Gate Array (FPGA) circuits marketed by the company Xilinx. These circuits are made up of look-up tables or memories that can be programmed independently, and interconnection elements that are also programmable. The look-up tables have a fine programming granularity, generally to the bit level, and can be used to implement conventional logic functions such as OR and AND functions, for example, with two or three inputs.

When implementing a multiplier with such circuits, the result is a circuit having a large surface area. Families of products marketed by Xilinx, such as the products of the Virtex family, do indeed incorporate multipliers, for example, 18×18 bit multipliers. However, the designer is faced with some inflexibility in programming these multipliers, since it is difficult to produce, from these 18×18 bit multipliers, 8×8 bit multipliers or 32×32 bit multipliers, for example.

SUMMARY OF THE INVENTION

An object of the present invention is to provide an electronic circuit that is configurable and exhibits a high degree of programming flexibility. In particular, the circuit may be dedicated to arithmetic calculations, such as the types of calculations performed in baseband processors incorporated in cellular mobile telephones, for example. The circuit may be produced before the arithmetic and/or logic functions are known, wherein these functions will actually be executed in the application being considered.

Another object of the present invention is to provide such a circuit that is programmable at the bit level while having a reasonable size.

The reconfigurable electronic circuit according to the present invention includes at least one tile or building block circuit. This tile comprises at least two individual cells interconnected.

Each individual cell may comprise the following: a multiplier; an arithmetic and logic unit for performing at least one arithmetic and/or logic function that can be selected from a predetermined set of arithmetic and/or logic functions; a vertical bus; a first configurable switching block connected to the vertical bus and to the inputs of the multiplier; second configurable switching means or circuit connected to the vertical bus and to the output of the multiplier; and a third configurable switching means or circuit connected to the vertical bus and to the output of the multiplier of the other individual cell.

Each cell may further comprise the following: a second configurable switching block connected to the vertical bus and to the inputs of the arithmetic and logic unit; fourth configurable switching means or circuit connected to the vertical bus and to the output of the arithmetic and logic unit; a carry propagation bus linking the two arithmetic and logic units of the individual cells; a terminal switching block that is configurable and connected to the vertical bus; and a horizontal bus linking the two terminal switching blocks of the two individual cells.

The configurable nature of the tile arises in particular from the configurable nature of the arithmetic and logic units with respect to the arithmetic and/or logic functions that can be selected (configured) from a set of possible predetermined functions, and from the configurable nature of the switching (interconnection) blocks and circuit. This implies that some or all of the bits of the words conveyed over the horizontal and vertical buses can be selected, so as to be able to, on command, either switch them to one or the other of the two individual cells or perform arithmetic, logic or multiplication operations with a variable number of bits.

Control means or a control circuit is assigned to the tile to deliver configuration signals for configuring the various registers and elements of the arithmetic and logic units, multipliers and the switching circuits and blocks. According to one embodiment, each multiplier may be an m×n bit multiplier having two inputs intended to receive two words of m and n bits respectively, and an output intended to deliver an output word of m+n bits.

The second switching means or circuit of a first individual cell of the tile is then intended to receive n lower order bits of the output word delivered by the multiplier of the first cell, while the third switching means or circuit of this first individual cell is intended to receive n lower order bits of the output word delivered by the multiplier of the second individual cell of the tile.

Furthermore, the second switching means or circuit of the second individual cell is intended to receive m higher order bits of the output word delivered by the multiplier of this second cell, while the third switching means or circuit of this second individual cell is intended to receive m higher order bits of the output word delivered by the multiplier of the first individual cell.

Thus, when carrying out, for example, a complex multiplication of a first complex number $a_r+ja_i$ by a second complex number $b_r+jb_i$, a tile will execute the partial products $a_r*b_r$ and $a_i*b_i$. If it is assumed that $a_r$, $a_i$ is coded with n bits and $b_r$, $b_i$ is coded with m bits, the vertical bus of a first individual cell conveys to the output of the multiplier the 2n lower order bits of the result of the multiplication, that is, the n lower order bits of the product $a_r*b_r$ and the n lower order bits of the product $a_i*b_i$.

Furthermore, the vertical bus of the other individual cell conveys the 2m higher order bits, that is, the m higher order bits of the product $a_r*b_r$ and the m higher order bits of the product $a_i*b_i$. In such an embodiment, each bus of the tile can, for example, convey words having a number of bits at least equal to the lowest common multiple (LCM) of m and n.

According to one particularly straightforward embodiment, m is equal to n. In this case, each bus of the tile has, for example, p tracks of n bits, with p being an integer greater than 1. Thus, in one such embodiment, the configurable switching circuits and blocks can be configured to select particular tracks of the bus, so as, for example, to process words of n bits being conveyed on a particular track of a bus and to return the result of the operation on another track of the bus.

To implement a configurable circuit having a larger structure with more calculation possibilities or one that is able to perform calculations on data having a greater number of bits, several tiles can be interconnected. Moreover, it is particularly advantageous that the tiles then be connected in quincunx form, which facilitates in particular the sequencing of the operations in the case of multiplications on high numbers of bits involving several tiles.

According to one embodiment of the invention, the circuit additionally includes a sign extension module connected to two adjacent tiles of the same horizontal row. This sign extension module is connected between the arithmetic and logic unit of an individual cell of a first tile and the vertical bus of the individual cell of the second tile. This cell is immediately adjacent to the individual cell of the first tile.

The presence of such an extension module means that sign extension can be implemented without using, in this respect, the arithmetic and logic unit. However, in certain applications, it may be possible to dispense with such a sign extension module and implement this function in the arithmetic and logic unit.

So that extended accumulation operations, in particular, can be implemented easily, it is especially advantageous that the tile also include an additional row of arithmetic and logic units. More specifically, such an additional row includes two vertical bus extensions connected to two terminal switching blocks respectively; two additional terminal switching blocks connected to the two vertical bus extensions respectively; one additional horizontal bus connected between the two additional terminal blocks; two additional arithmetic and logic units connected to the two vertical bus extensions respectively, via additional configurable switching circuits; and one additional carry propagation bus connected between the two additional arithmetic and logic units.

Then, advantageously, provision is made for specific buses enabling long connections interlinking additional arithmetic and logic units of adjacent tiles of the same column. The configurable circuit according to the invention may be implemented in the form of an integrated circuit, for example.

BRIEF DESCRIPTION OF THE DRAWINGS

Other advantages and features of the invention will become apparent upon examination of the detailed description of entirely non-limiting embodiments, and of the accompanying drawings in which.

DETAILED DESCRIPTION OF THE PREFERRED EMBODIMENTS

Figure 1:
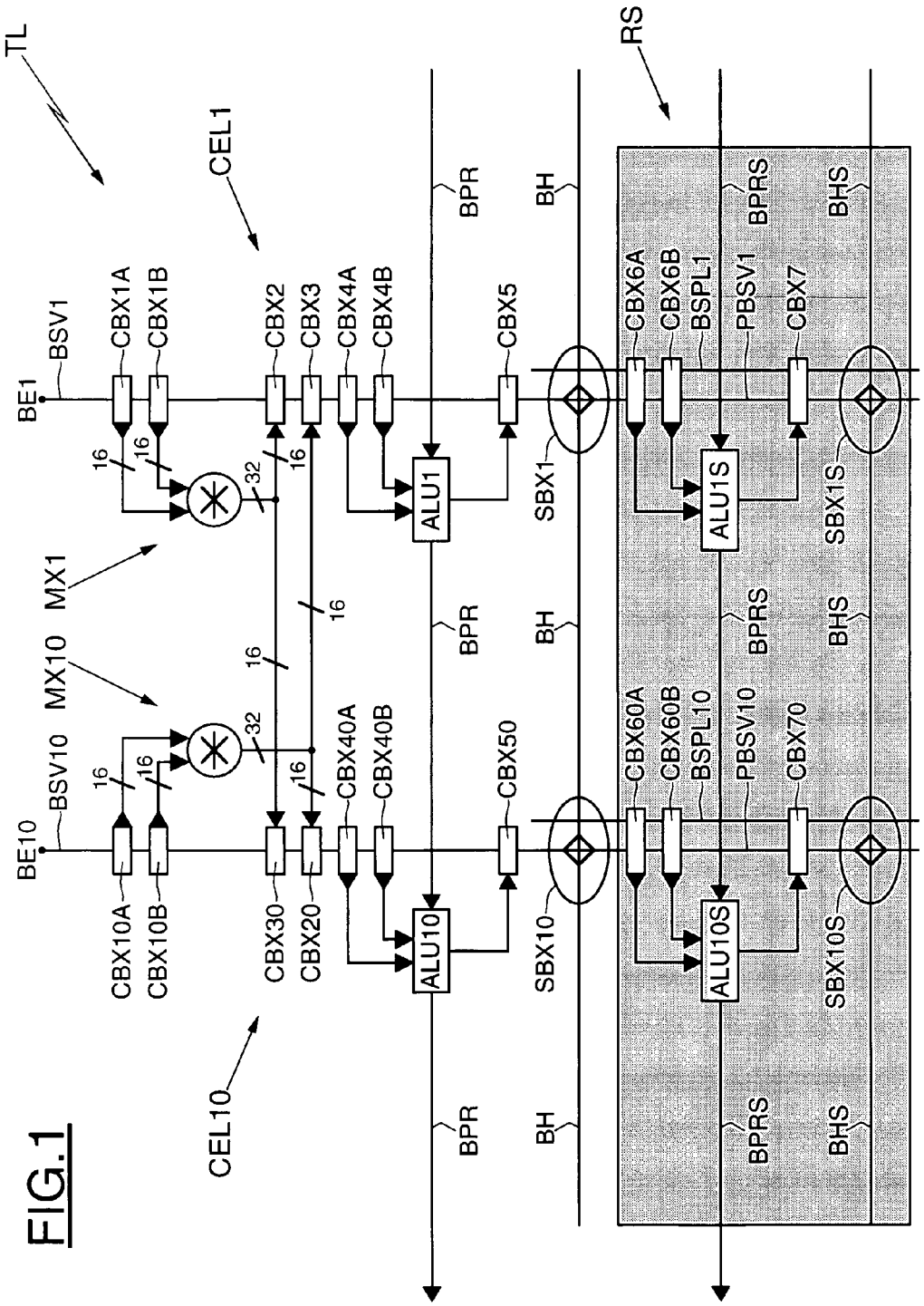
FIG. 1 shows schematically an embodiment of a tile according to the present invention.

In FIG. 1, the reference TL denotes a tile or building block circuit of a configurable circuit according to the invention. The illustrated tile TL is itself configurable and is made up of two individual cells CEL1 and CEL10 that are interconnected. The cell CEL1 has a terminal BE1, which may be an input terminal or an output terminal.

From this terminal BE1 extends a vertical bus BSV1 made up in this case of p tracks of n bits each, for example, 16 bits each. On this vertical bus BSV1, there is arranged a first configurable switching block, in this case made up of two individual switching circuits CBX1A and CBX1B.

The lateral outputs of these two individual switching circuits CBX1A and CBX1B are linked via two secondary buses to two inputs of a multiplier MX1, which is in this case an n×n bit multiplier. This multiplier MX1 delivers a 2n-bit output word (in this particular case 32 bits) on an output bus which is split into two parts.

A first part of this bus, conveying in this case n bits, is connected to a second configurable switching circuit CBX2 also connected to the vertical bus BSV1. The second part of this output bus, also conveying n bits, is linked to a third configurable switching circuit CBX30 connected to the vertical bus BSV10 of the other individual cell of the tile, referenced CEL10.

The third configurable switching circuit CBX3 of the cell CEL1 is, for its part, connected both to the vertical bus BSV1 and to the output of the multiplier MX10 of the cell CEL10. This switching circuit CBX3 is intended to receive n bits of the output word delivered by the multiplier MX10, while the n remaining bits are delivered to the second configurable switching circuit CBX20 of the cell CEL10.

A second configurable switching block is in this case made up of two individual switching circuits CBX4A and CBX4B which are connected both to the vertical bus BSV1 and to the two inputs of an arithmetic and logic unit ALU1. A fourth configurable switching circuit CBX5 is connected to the vertical bus and to the output of the arithmetic and logic unit ALU1. Furthermore, a carry propagation bus BPR links the two arithmetic and logic units ALU1 and ALU10 of the two cells CEL1 and CEL10.

A configurable terminal switching block SBX1 is connected both to the vertical bus BSV1 and to a horizontal bus BH linking the two terminal switching blocks SBX1 and SBX10 of the two cells CEL1 and CEL10. This horizontal bus BH is also, in this case, a bus made up of p tracks of n bits each.

For the case in which the tile TL does not include an additional row RS of arithmetic and logic units, such as that shown by the shaded area in FIG. 1, the two terminal switching blocks SBX1 and SBX10 form two other input/output terminals of the tile TL. Of course, the switching circuits CBX10A, CBX10B, CBX40A, CBX40B and CBX50 are identical to the equivalent circuits of the cell CEL1.

Before returning in greater detail to the structure and functionality of the additional row RS of arithmetic and logic units, reference will now be made more particularly to FIG. 2 to introduce a yet more general embodiment of the tile according to the invention. More specifically, according to FIG. 2, the multipliers MX1 and MX10 of the two cells CEL1 and CEL10 of the tile TL are m×n bits multipliers, and consequently deliver m+n bit output words.

Figure 2:
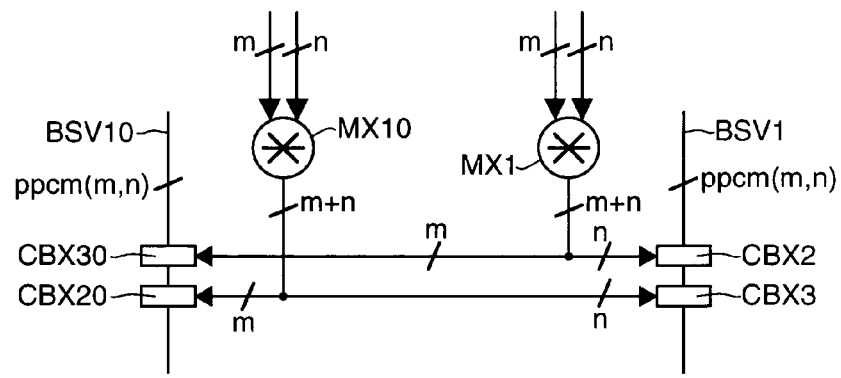
FIG. 2 illustrates in greater detail one part of the tile of FIG. 1 in a specific application.

In this case, as illustrated in FIG. 2, the n bits of the output word delivered by the multiplier MX1 are directed to the second switching circuit CBX2 while the remaining m bits are directed to the third switching circuit CBX30 of the cell CEL10.

Likewise, the n bits of the output word delivered by the multiplier MX10 are delivered to the third switching circuit CBX3 of the cell CEL1 while the remaining m bits are directed to the second switching circuit CBX20 of the cell CEL10. In this embodiment, each of the vertical buses BSV1 and BSV10 has a number of bits at least equal to the lowest common multiple of m and of n (LCM(m,n)).

Figure 3:
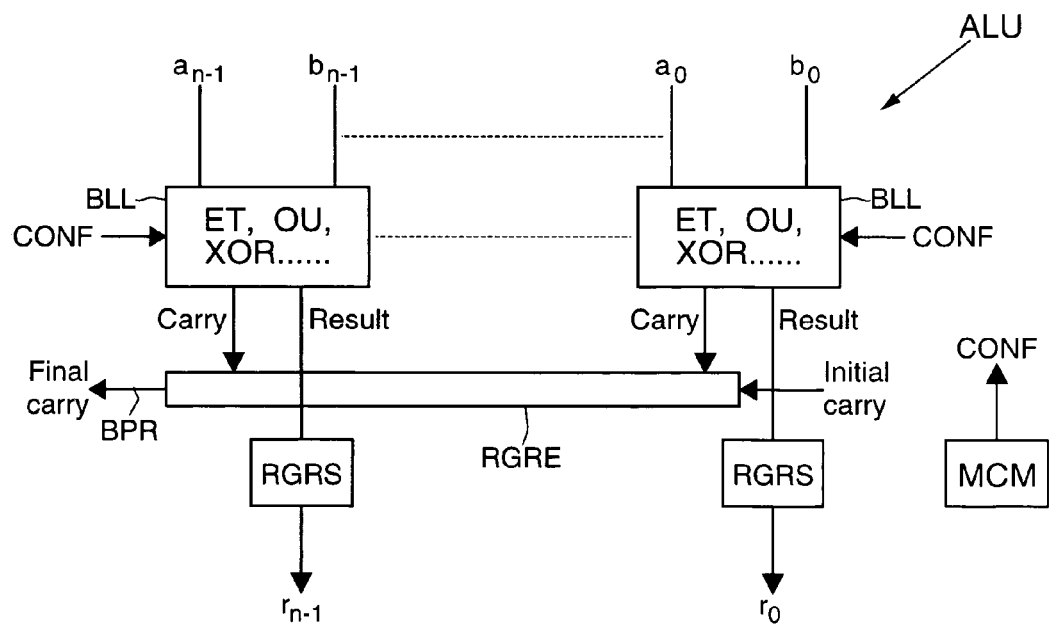
FIGS. 3 to 7 shows schematically in greater detail certain parts of the tile according to the present invention.

Reference will now be made more particularly to FIGS. 3 to 7 to describe in greater detail certain parts of the individual cells of the tile TL. FIG. 3 schematically illustrates an embodiment of an arithmetic and logic unit ALU. Such a unit is conventional and has a structure that is known. More specifically, it includes in this case blocks BLL capable of performing predetermined arithmetic and/or logic functions. These blocks BLL can be configured by configuration signals CONF sent by controller MCM. During each application, the blocks BLL can be configured via these configuration signals to define the arithmetic and/or logic functions that will actually be carried out by the unit ALU.

These blocks BLL each receive two bits $a_i$, $b_i$ belonging to two input words received by the unit ALU. The n bits of the result $r_i$ are, for example, stored in registers RGRS which in this case are pipeline registers intended to improve the speed-related performance of the tiles. This being the case, the storage of result bits in registers is not obligatory. Moreover, circuit RGRE can be used to store the possible carry resulting from operations performed by the blocks BLL. The final carry is transmitted on the carry propagation bus BPR. The circuit RGRE receives an initial carry, for example, equal to zero for an addition and equal to 1 for a subtraction.

Figure 4:
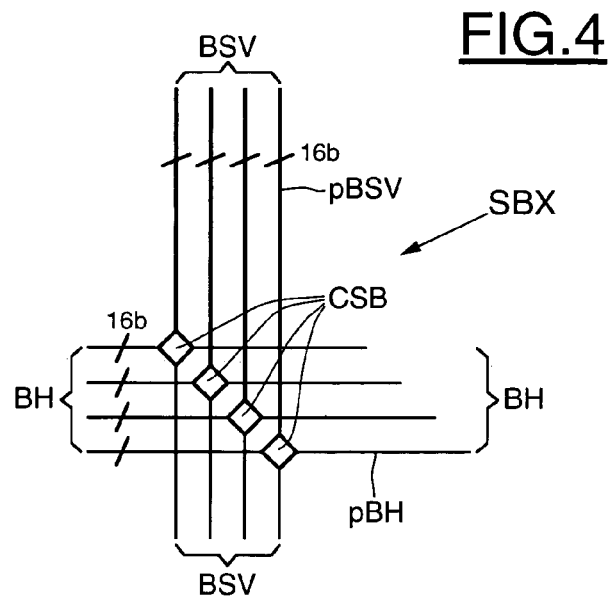
Figure 5:
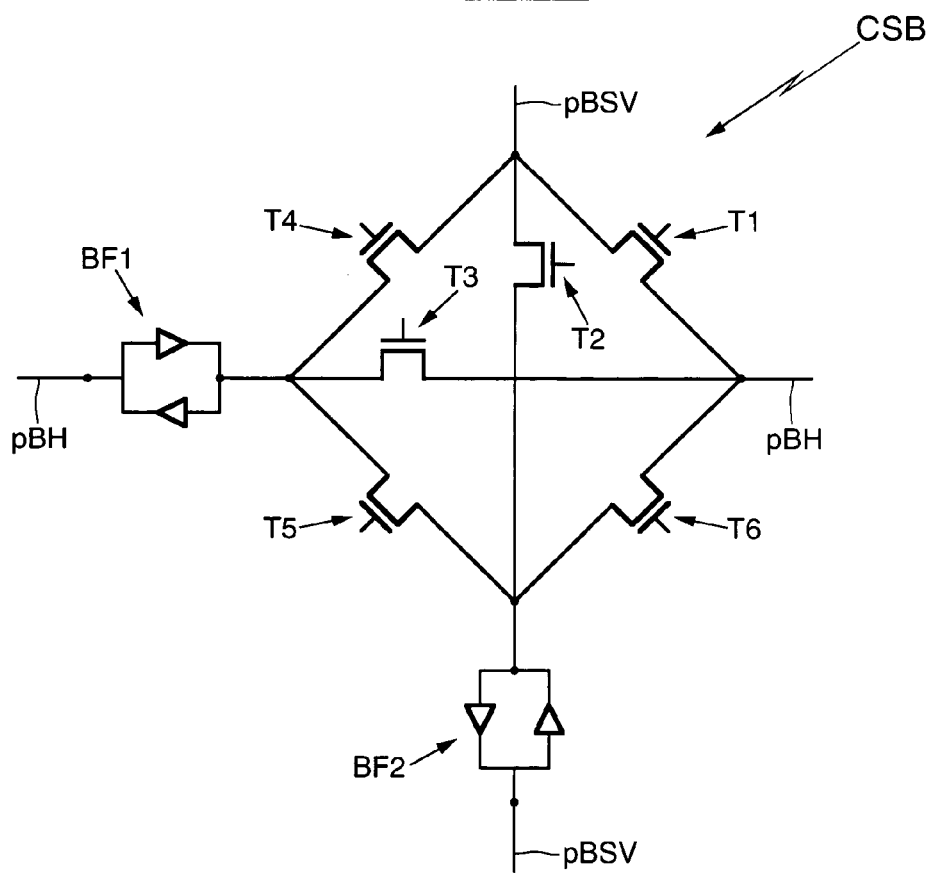

FIGS. 4 and 5 illustrate more precisely the structure of a terminal switching block such as, for example, the one referenced SBX1. This terminal block SBX, or crossbar, has as many individual interconnection circuits CSB as there are tracks p on the vertical and horizontal buses BSV, BH. In the example of FIG. 4, the number of tracks p is equal to 4, and each track is able to convey 16-bit words, for example.

Each individual interconnection circuit CSB is placed at the intersection between a track pBSV of the vertical bus BSV and the equivalent track pBH of the horizontal bus BH. Each individual interconnection circuit CSB is configurable in that a word from a track of one of the buses BSV or BH can be switched to the equivalent track of the same bus or of the orthogonal bus, and this is regardless of the direction of conveyance of the word.

In this respect, an individual interconnection circuit CSB may be, for example, the one illustrated schematically in FIG. 5. In this case, an interconnection circuit includes six transistors T1–T6 connected in a diamond configuration. Each transistor is controlled at its gate so as to configure the switching thus achieved. Moreover, at two of the inputs/outputs, provision may be made, preferably, for pairs of amplifiers with tristate control BF1 and BF2 (buffers). These buffers reshape the signal at two interconnection stages, and the direction chosen depends on the direction of propagation of the signal (position of the source). Even then, the control signals of the transistor gates and of the tristate buffers are provided by the controller MCM.

Figure 6:
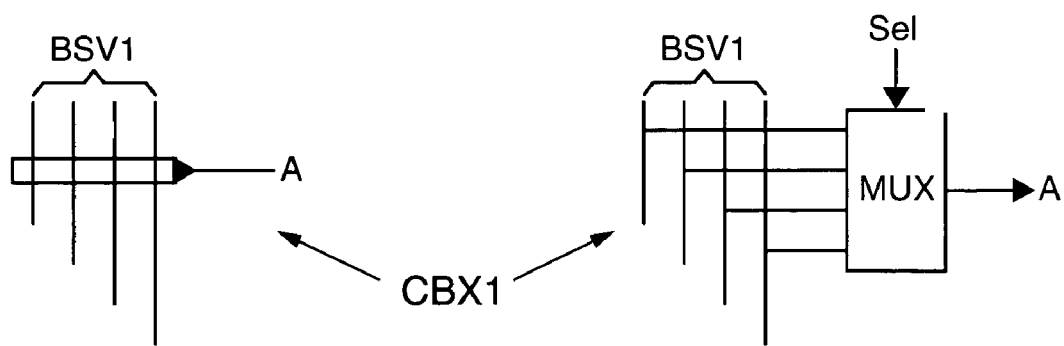

FIG. 6 schematically represents a switching circuit, such as one of the above referenced types CBX1A, for example. The left part of FIG. 6 schematically shows this switching circuit, such as the one illustrated in FIG. 1, for example.

The right part of FIG. 6 schematically shows an example internal architecture corresponding to this representation. Thus, the switching circuit CBX1 can be formed by a multiplexer with four inputs and one output, configurable via a configuration signal SEL also issued by the controller MCM. Thus, with the switching circuit CBX1, it is possible to select one of the tracks of the bus BSV1 to copy the word A being conveyed on this selected track to the output of the multiplexer.

Figure 7:
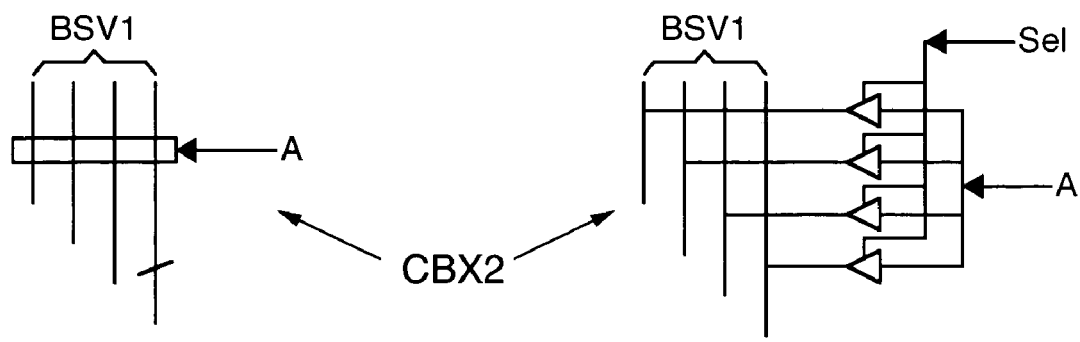

FIG. 7 illustrates in greater detail another type of switching circuit, for example, of the type of the one referenced CBX2. Here too, in the same way as in FIG. 6, the left part of FIG. 7 is a schematic representation of this switching circuit, such as the one which features, for example, in FIG. 1, while the right part illustrates an example embodiment thereof.

More specifically, the switching circuit CBX2 has tristate inverter elements controlled by a configuration signal SEL also issued by the controller MCM. Thus, a word A arriving at the input of the switching circuit CBX2 can be switched, depending on the value of the signal SEL, to one of the tracks of the bus BSV1.

While the tile TL illustrated in FIG. 1 is for carrying out simple operations, such as 16×16 bit multiplications or 8×8 bit multiplications, for example, it is possible, by interconnecting several tiles TL, vertically and/or horizontally, to perform more complex operations, or for example, multiplications on a larger number of bits.

Figure 8:
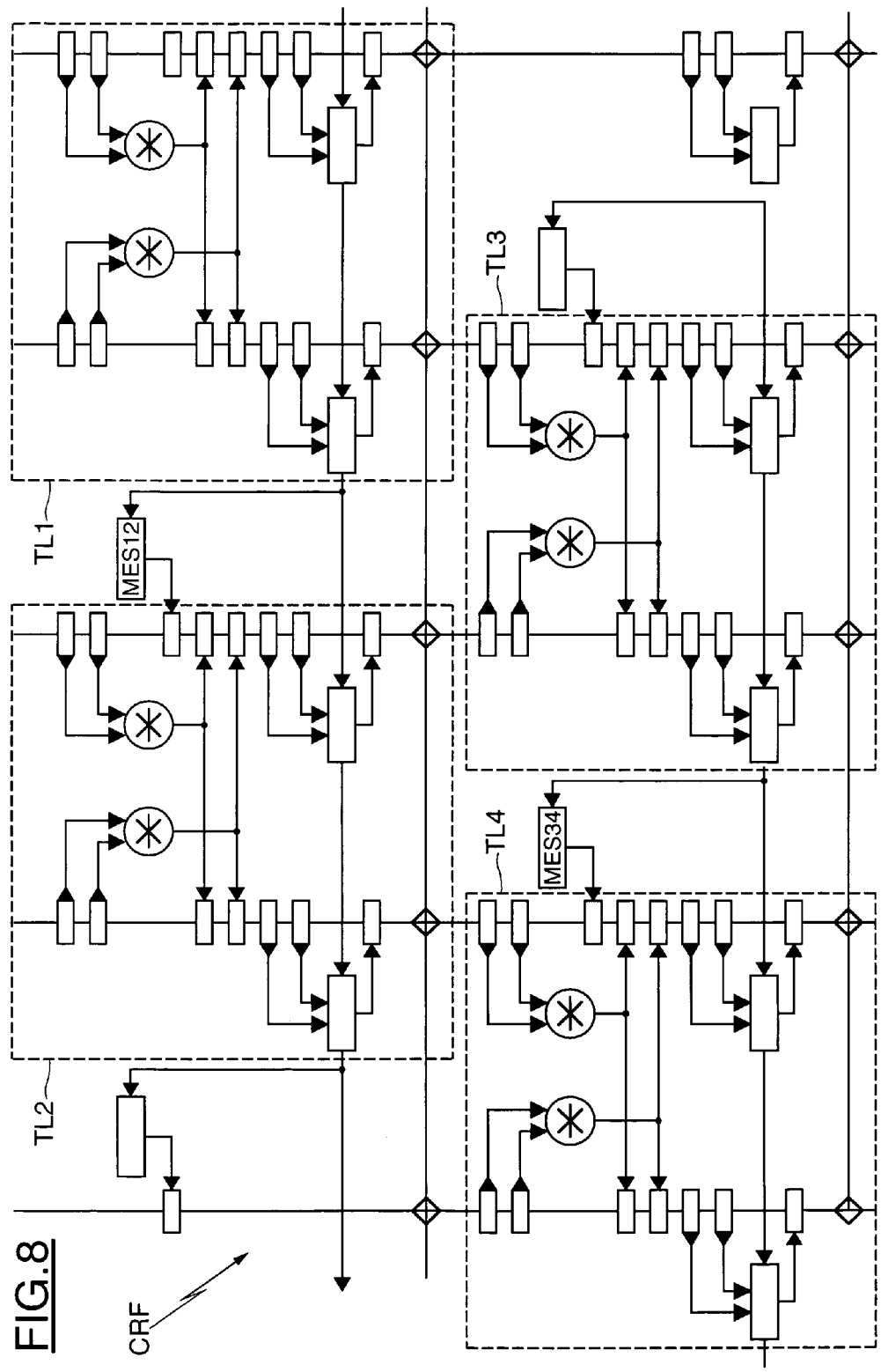
FIG. 8 illustrates one embodiment of a circuit according to the present invention having several tiles connected in a quincunx fashion.

FIG. 8 illustrates a configurable circuit in which the tiles (in this case four tiles are represented) are connected in a quincunx form. Such a quincunx-type connection facilitates the sequencing of operations during multiplications on a large number of bits as will be discussed in greater detail below.

The tiles are quincunx-connected such that the vertical bus of the individual right-hand cell (in FIG. 8) of the tile TL3 is connected, via the terminal switching block (crossbar) to the vertical bus of the individual left-hand cell of the tile TL1. Likewise, the vertical bus of the individual left-hand cell of the tile TL3 is connected via a crossbar to the vertical bus of the individual right-hand cell of the tile TL2.

Furthermore, the tiles of the same horizontal row (line) are interconnected via horizontal buses and crossbars, and via carry propagation buses. In the example shown here, it is assumed that the tiles TL were not furnished with additional rows RS of arithmetic and logic units.

Moreover, the configurable circuit CRF includes, between two tiles of a given row, sign extension modules MES12, MES34 for performing the sign extension function which may be necessary during operations performed by the arithmetic and logic units. The presence of these sign extension modules means that the arithmetic and logic units need not perform this function, and this moreover means that their processing capability need not be reduced.

Figure 9:
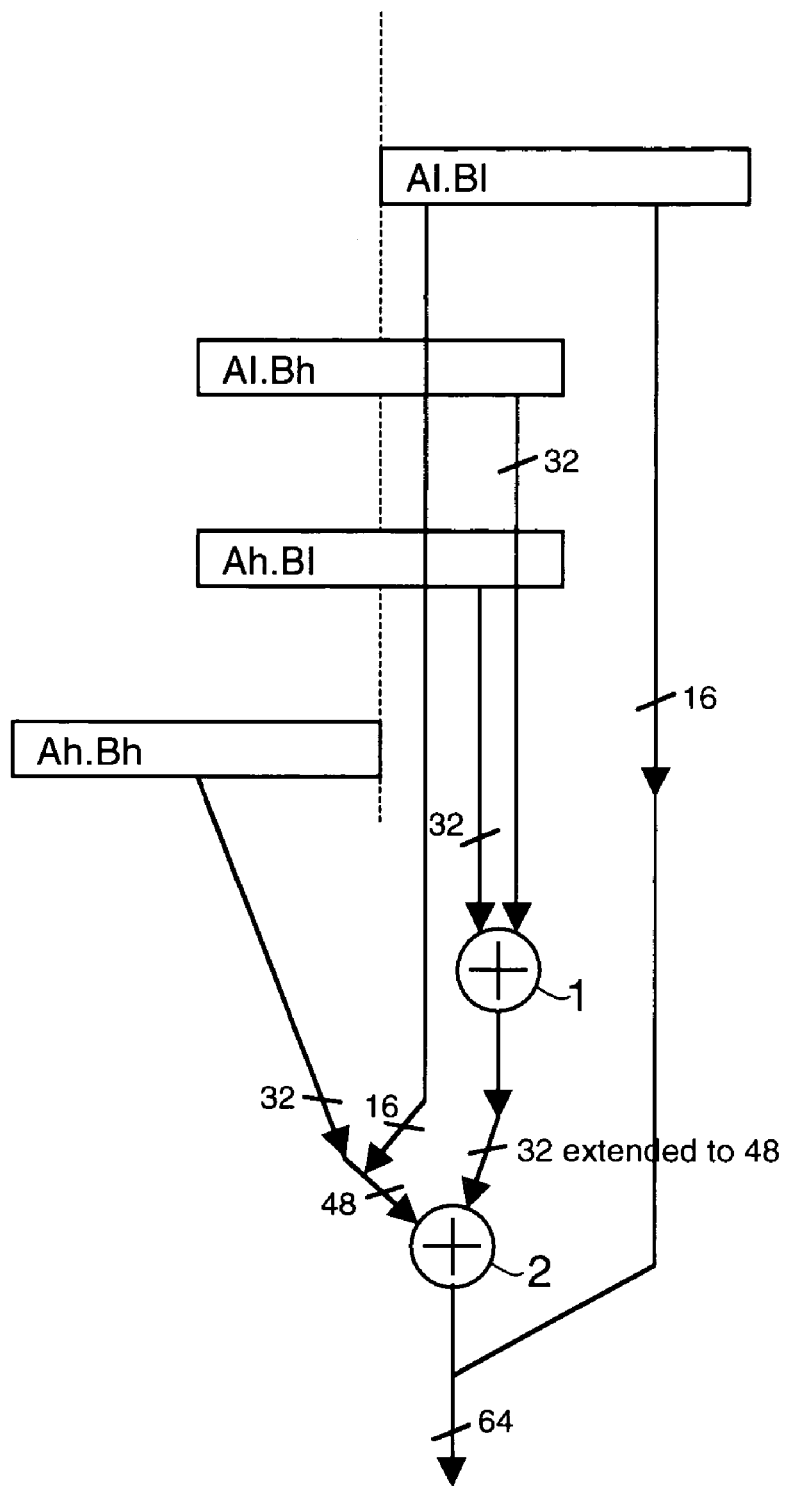
FIGS. 9 and 10 show schematically an example operation that can be performed by a circuit according to the present invention.

FIG. 9 shows an example implementation of a 32×32 bit multiplication performed in a 32×32 bit multiplier implemented using four 16×16 bit multipliers. More specifically, the multiplication to be performed is the multiplication A*B, where A and B are two 32-bit numbers each having 16 higher order bits Ah and Bh, and 16 lower order bits Al and Bl.

As indicated in FIG. 9, the four multiplications carried out are the products Al*Bl, Al*Bh, Ah*Bl and Ah*Bh respectively. Two additions, labelled 1 and 2 in FIG. 9, are used to obtain, together with these multiplications, the result of the multiplication on 64 bits.

Figure 10:
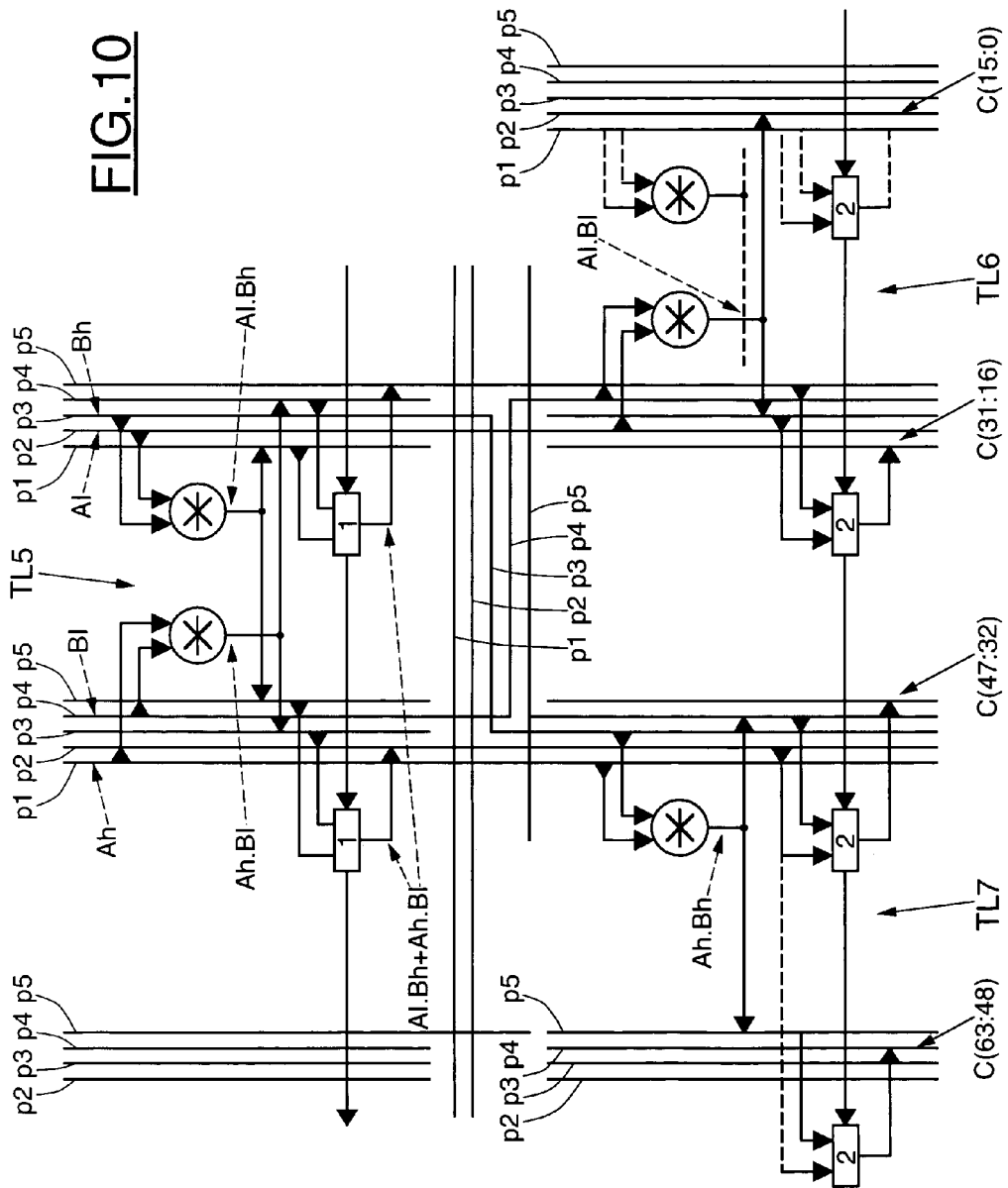

The 32×32 bit multiplier for performing this multiplication is, for example, the one represented in FIG. 10. In this figure, three tiles TL5, TL6, TL7 have been used. It has also been assumed that the number of tracks of the vertical and horizontal buses was 5 and the tracks were referenced p1–p5 respectively.

FIG. 10 also shows the configuration of the various switching blocks and circuits. More specifically, for example, the bits Ah are delivered as input on the track p1 of the vertical bus of the individual left-hand cell of the tile TL5. The bits Bl are delivered as input on the track p4 of the left-hand cell of the tile TL5. The bits Al are delivered as input on the track p2 of the right-hand cell of the tile TL5. The bits Bh are delivered as input on the track p3 of the right-hand cell of the tile TL5.

The multiplier of the left-hand cell of the tile TL5 performs the product Ah*Bl while the multiplier of the right-hand cell of the tile TL5 performs the product Al*Bh. The output word of the multiplier of the left-hand cell of the tile TL5 is distributed on the track p3 of the vertical bus of the left-hand cell, and on the track p4 of the vertical bus of the right-hand cell of the tile TL5.

The output word of the multiplier of the right-hand cell of the tile TL5 is distributed on the track p5 of the vertical bus of the left-hand cell of the tile TL5 and on the track p1 of the vertical bus of the right-hand cell of the tile TL5.

The two arithmetic and logic units of the tile TL5 perform the addition operation No. 1 (FIG. 9) and as a result supply, on the track p2 of the vertical bus of the left-hand cell of the tile TL5 and on the track p5 of the vertical bus of the right-hand cell of the tile TL5, the result of the arithmetic operation Al*Bh+Ah*Bl.

In regards now to the configuration of the two terminal switching blocks (crossbars) for connecting the tile TL5 to the tiles TL6 and TL7, it will be noted that: the track p1 of the vertical bus of the left-hand cell of the tile TL5 is connected to the track p1 of the vertical bus of the right-hand cell of the tile TL7; the track p2 of the vertical bus of the left-hand cell of the tile TL5 is connected to the track p2 of the vertical bus of the right-hand cell of the tile TL7; the tracks p3 and p5 of the vertical bus of the left-hand cell of the tile TL5 are not connected to any other track; the track p4 of the vertical bus of the left-hand cell of the tile TL5 is connected, via the track p4 of the horizontal bus, to the track p4 of the vertical bus of the left-hand cell of the tile TL6; the tracks p1 and p4 of the vertical bus of the right-hand cell of the tile TL5 are not connected to any other track; the track p2 of the vertical bus of the right-hand cell of the tile TL5 is connected to the track p2 of the vertical bus of the left-hand cell of the tile TL6; the track p3 of the vertical bus of the right-hand cell of the tile TL5 is connected, via the track p3 of the horizontal bus, to the track p3 of the vertical bus of the right-hand cell of the tile TL7; and the track p5 of the vertical bus of the right-hand cell of the tile TL5 is connected to the track p5 of the vertical bus of the left-hand cell of the tile TL6.

The multiplier of the right-hand cell of the tile TL7 gives the product Ah*Bh, and the result is distributed on the track p5 of the vertical bus of the left-hand cell of the tile TL7 and on the track p4 of the vertical bus of the right-hand cell of this same tile TL7.

The multiplier of the left-hand cell of the tile TL6 gives the product Al*Bl and the result is distributed on the track p3 of the vertical bus of the left-hand cell of the tile TL6 and on the track p2 of the vertical bus of the right-hand cell of this same tile TL6.

The three arithmetic and logic units of the left-hand cell of the tile TL6 and of the two cells of the tile TL7 perform the addition operation no. 2 in FIG. 9, with a sign extension EXTS indicated by the dashed line in FIG. 10. The sixteen least significant bits of the result C are delivered to the track p2 of the vertical bus of the right-hand cell of the tile TL6.

Bits 16 to 31 are delivered to the track p1 of the vertical bus of the left-hand cell of the tile TL6. Bits 32 to 47 are delivered to the track p5 of the vertical bus of the right-hand cell of the tile TL7. Moreover, the remaining bits that are the most significant bits, that is, bits 48 to 63, are delivered to track p4 of the vertical bus of the left-hand cell of the tile TL7.

Let us now return to FIG. 1 to describe in greater detail the structure of the additional row RS of arithmetic and logic units, which a tile TL may include. The additional row RS has two vertical bus extensions PBSV1 and PBSV10 connected to the two terminal switching blocks SBX1 and SBX10 respectively.

This row also has two additional terminal switching blocks SBX1S and SBX10S connected to the two vertical bus extensions PBSV1 and PBSV10 respectively. These two additional switching terminal blocks are interconnected via an additional horizontal bus BHS.

Two additional arithmetic and logic units ALU1S and ALU10S are connected, respectively, to the two vertical bus extensions PBSV1 and PBSV10 via additional switching circuits CBX6A, CBX6B, CBX7, and CBX60A, CBX60B and CBX70. Finally, an additional carry propagation bus BPRS is connected between the two additional arithmetic and logic units ALU1S and ALU10S.

Figure 11:
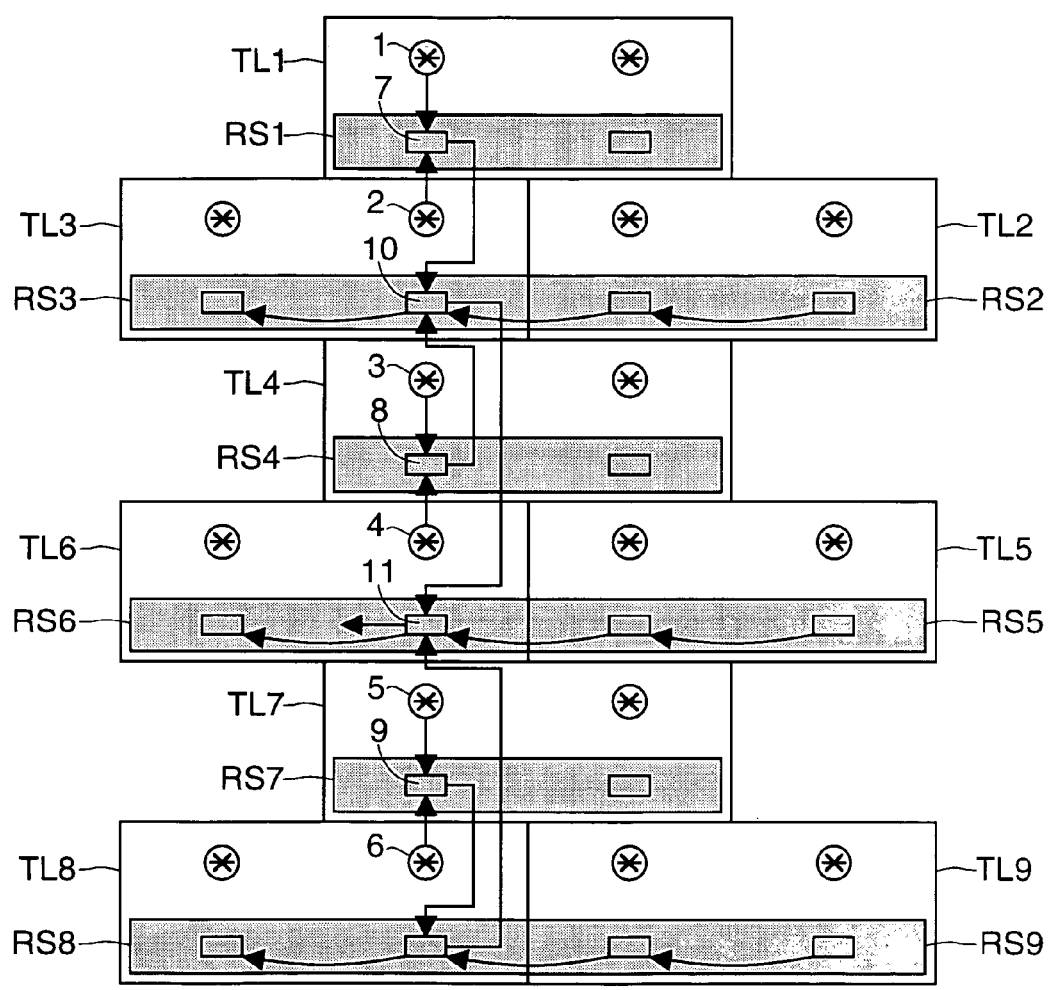
FIGS. 11 and 12 show schematically another example operation that can be performed by a circuit according to the present invention.

As well as the circuits that have just been described, provision is also made for specific buses BSPL1, BSPL10 intended to interconnect the additional arithmetic and logic units of adjacent tiles of a given column. Such a connection, that can be referred to as a long connection, as opposed to the local connections made by the various switching circuits and blocks of the tile, is more particularly illustrated in FIG. 11. FIG. 11 shows several tiles TL1–TL9 connected in a quincunx form and each is furnished with an additional row of arithmetic and logic units.

Figure 12:
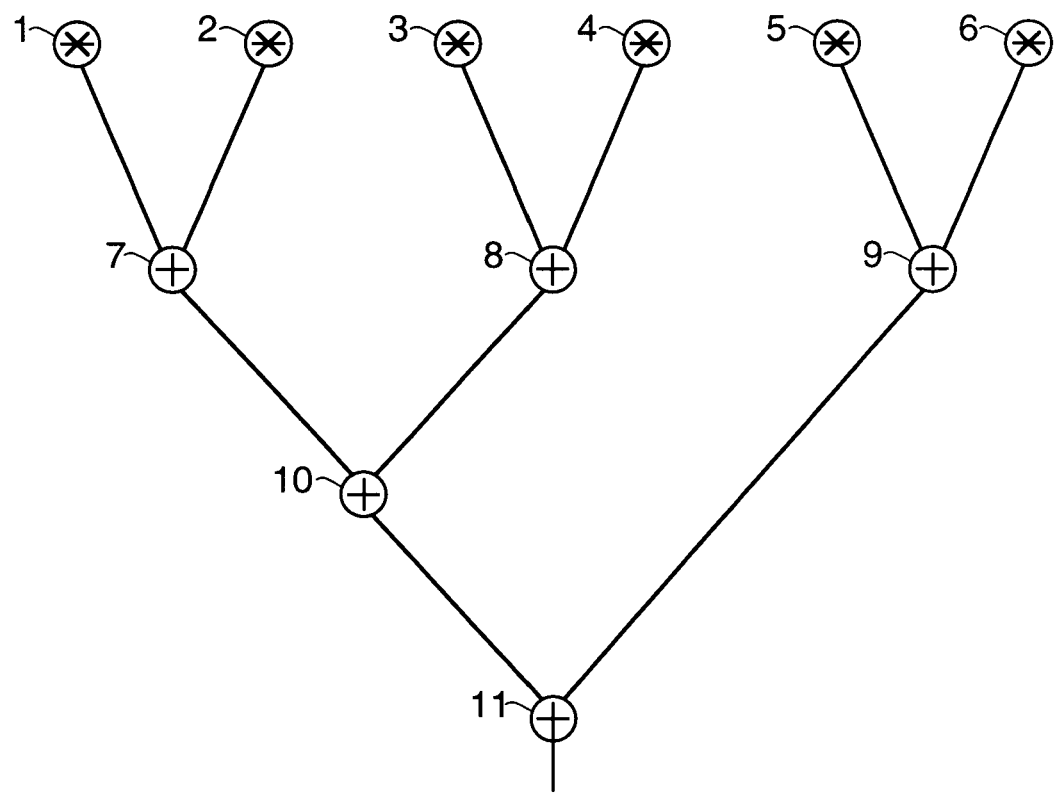

These additional rows, together with the specific long-connection buses, can be used, for example, to perform very straightforward accumulation operations, or for example, filtering operations, such as the sequences of operations illustrated in FIG. 12, for example. In this FIG. 12, which represents operations performed for example during a filtering process, there are represented six multiplications 1 to 6, and four additions 7 to 11.

As illustrated in FIG. 11, multiplication no. 1 is performed in the multiplier of the left-hand cell of the tile TL1, while multiplication no. 2 is performed in the multiplier of the right-hand cell of the tile TL3.

Addition no. 7 is performed in the left-hand additional arithmetic and logic unit of the additional row RS1 of the tile TL1 and the result is transmitted, via a long connection, to the right-hand additional arithmetic and logic unit of the row RS3 of the tile TL3.

Multiplications no. 3 and no. 4 are performed, respectively, in the left-hand and right-hand multipliers of the tiles TL4 and TL6, while addition No. 8 is performed in the left-hand additional arithmetic and logic unit of the additional row RS4 of the tile TL4. The result of this addition is transmitted via a long-connection bus to the right-hand arithmetic and logic unit of the additional row RS3, which performs addition No. 10.

Multiplications no. 5 and no. 6 are performed, respectively, in the left-hand multiplier of the tile TL7 and in the right-hand multiplier of the tile TL8, while addition no. 9 is performed in the left-hand additional arithmetic and logic unit of the additional row RS7 of the tile TL7.

The result of this addition is transmitted to the right-hand additional arithmetic and logic unit of the additional row RS6 of the tile TL6 via a long-connection bus. This additional arithmetic and logic unit which also receives the result of addition no. 10 performs addition no. 11 and supplies the final result of the operations.

The configurable circuit according to the invention can thus be used to implement a number of basic operations, for example, those often used in algorithms implemented within digital signal processors (DSPs). Such operations are, for example, 16×32 bit multiplications, 32×32 bit multiplications, 16×16 bit complex multiplications, infinite impulse response filters, and radix 2 or radix 4 butterfly operations used in direct or inverse Fourier data transform calculations.

The configurable circuit according to the invention also forms a configurable data path and it can be modified and extended by connecting several tiles so as to form a structure of variable size with greater computational power or enabling processing of data occupying a much higher number of bits.

Furthermore, the circuit according to the invention is not limited to the embodiments that have just been described but covers all variants thereof. Thus, the terminal blocks of the tiles could be located at terminals BE1 and BE10. Also, the order in the arrangement of multipliers and arithmetic and logic units on the buses could be reversed. The same applies for the arrangement of the additional row RS which could be connected at the upper part of the tile (in FIG. 1).

That which is claimed is:

1. A configurable electronic circuit comprising:
   at least one tile comprising a plurality of interconnected cells, each cell comprising
   a multiplier,
   an arithmetic and logic unit (ALU) for performing at least one arithmetic and/or logic function from a set of functions,
   a vertical bus,
   a first configurable switching circuit connected to said vertical bus and to inputs of said multiplier,
   a second configurable switching circuit connected to said vertical bus and to an output of said multiplier,
   a third configurable switching circuit connected to said vertical bus and to an output of said multiplier in a different cell,
   a fourth configurable switching circuit connected to said vertical bus and to inputs of said ALU,
   a fifth configurable switching circuit connected to said vertical bus and to an output of said ALU,
   a carry propagation bus linking said ALU with said ALU in the different cell,
   a configurable terminal switching circuit connected to said vertical bus, and
   a horizontal bus linking said configurable terminal switching circuit with said configurable terminal switching circuit in the different cell.

2. A configurable electronic circuit according to claim 1, wherein said plurality of cells include first and second cells; wherein each multiplier comprises an m*n bit multiplier having two inputs for receiving two words of m and n bits respectively, and the output of each multiplier provides an output word of m+n bits; wherein said second configurable switching circuit in the first cell receives n bits of an output word delivered by said multiplier in the same cell; wherein said third configurable switching circuit of the first cell receives n bits of the output word delivered by said multiplier in the second cell; wherein said second configurable switching circuit in the second cell receives m bits of the output word delivered by said multiplier in the second cell; and wherein said third configurable switching circuit in the second cell receives m bits of the output word delivered by said multiplier in the first cell.

3. A configurable electronic circuit according to claim 2, wherein said vertical bus, said carry propagation bus and said horizontal bus each conveys words having a number of bits at least equal to a lowest common multiple of m and of n.

4. A configurable electronic circuit according to claim 2, wherein m is equal to n, and said vertical bus, said carry propagation bus and said horizontal bus each comprises p tracks of n bits, with p being an integer greater than 1.

5. A configurable electronic circuit according to claim 1, wherein said at least one tile comprises a plurality of tiles interconnected.

6. A configurable electronic circuit according to claim 5, wherein said plurality of tiles are interconnected in a quincunx form.

7. A configurable electronic circuit according to claim 5, wherein said plurality of tiles include first and second tiles in a row; further comprising a sign extension module connected between said first and second tiles, said sign extension module being connected between said ALU in one cell in said first tile and said vertical bus of an immediately adjacent cell in said second tile.

8. A configurable electronic circuit according to claim 7, further comprising the following for each cell in said first and second tiles:
   a vertical bus extension connected to said configurable terminal switching circuit;
   an additional configurable terminal switching circuit connected to said vertical bus extension;
   an additional horizontal bus linking said additional configurable terminal switching circuit with said additional configurable terminal switching circuit in a different cell;
   an additional switching circuit;
   an additional ALU connected to said vertical bus extension via said additional switching circuit; and
   an additional carry propagation bus linking said additional ALU with said additional ALU in the different cell.

9. A configurable electronic circuit according to claim 8, further comprising an additional bus linking said additional ALU with said ALU in an adjacent cell in a same column.

10. A configurable electronic circuit according claim 1, further comprising a substrate with said at least one tile formed thereon so that the configurable electronic circuit is an integrated circuit.

11. A configurable electronic circuit comprising:
   a plurality of tiles interconnected;
   a respective sign extension module connected between adjacent tiles in a row;
   each tile comprising a plurality of cells interconnected, each cell comprising
   a multiplier,
   an arithmetic and logic unit (ALU) for performing at least one arithmetic and/or logic function from a set of functions,
   a vertical bus,
   a first configurable switching circuit connected to said vertical bus and to inputs of said multiplier,
   a second configurable switching circuit connected to said vertical bus and to an output of said multiplier,
   a third configurable switching circuit connected to said vertical bus and to an output of said multiplier in a different cell,
   a fourth configurable switching circuit connected to said vertical bus and to inputs of said ALU,
   a fifth configurable switching circuit connected to said vertical bus and to an output of said ALU,
   a carry propagation bus linking said ALU with said ALU in the different cell,
   a configurable terminal switching circuit connected to said vertical bus, and
   a horizontal bus linking said configurable terminal switching circuit with said configurable terminal switching circuit in the different cell.

12. A configurable electronic circuit according to claim 11, wherein said plurality of cells include first and second cells; wherein each multiplier comprises an m*n bit multiplier having two inputs for receiving two words of m and n bits respectively, and the output of each multiplier provides an output word of m+n bits; wherein said second configurable switching circuit in the first cell receives n bits of an output word delivered by said multiplier in the same cell; wherein said third configurable switching circuit of the first cell receives n bits of the output word delivered by said multiplier in the second cell; wherein said second configurable switching circuit in the second cell receives m bits of the output word delivered by said multiplier in the second cell; and wherein said third configurable switching circuit in the second cell receives m bits of the output word delivered by said multiplier in the first cell.

13. A configurable electronic circuit according to claim 12, wherein said vertical bus, said carry propagation bus and said horizontal bus each conveys words having a number of bits at least equal to a lowest common multiple of m and of n.

14. A configurable electronic circuit according to claim 12, wherein m is equal to n, and said vertical bus, said carry propagation bus and said horizontal bus each comprises p tracks of n bits, with p being an integer greater than 1.

15. A configurable electronic circuit according to claim 11, wherein said plurality of tiles are interconnected in a quincunx form.

16. A configurable electronic circuit according to claim 11, wherein said plurality of tiles include first and second tiles; each respective sign extension module being connected between said ALU in one cell in said first tile and said vertical bus of an immediately adjacent the cell in said second tile.

17. A configurable electronic circuit according to claim 16, further comprising the following for each cell in said first and second tiles:
a vertical bus extension connected to said configurable terminal switching circuit;
an additional configurable terminal switching circuit connected to said vertical bus extension;
an additional horizontal bus linking said additional configurable terminal switching circuit with said additional configurable terminal switching circuit in a different cell;
an additional switching circuit;
an additional ALU connected to said vertical bus extension via said additional switching circuit; and
an additional carry propagation bus linking said additional ALU with said additional ALU in the different cell.

18. A configurable electronic circuit according to claim 17, further comprising an additional bus linking said additional ALU with said ALU in an adjacent cell in a same column.

19. A configurable electronic circuit according claim 11, further comprising a substrate with said plurality of tiles formed thereon so that the configurable electronic circuit is an integrated circuit.

20. A method for making a configurable electronic circuit comprising:
interconnecting a plurality of cells in at least one tile, the interconnecting for each cell comprising
connecting a first configurable switching circuit to a vertical bus and to inputs of a multiplier,
connecting a second configurable switching circuit to the vertical bus and to an output of the multiplier,
connecting a third configurable switching circuit to the vertical bus and to an output of a multiplier in a different cell,
connecting a fourth configurable switching circuit to the vertical bus and to inputs of an arithmetic and logic unit (ALU),
connecting a fifth configurable switching circuit to the vertical bus and to an output of the ALU,
connecting a carry propagation bus between the ALU and an ALU in the different cell,
connecting a configurable terminal switching circuit to the vertical bus, and
connecting a horizontal bus between the configurable terminal switching circuit and a configurable terminal switching circuit in the different cell.

21. A method according to claim 20, wherein the plurality of cells include first and second cells; wherein each multiplier comprises an m*n bit multiplier having two inputs for receiving two words of m and n bits respectively, and the output of each multiplier provides an output word of m+n bits; wherein the second configurable switching circuit in the first cell receives n bits of an output word delivered by the multiplier in the same cell; wherein the third configurable switching circuit of the first cell receives n bits of the output word delivered by the multiplier in the second cell; wherein the second configurable switching circuit in the second cell receives m bits of the output word delivered by the multiplier in the second cell; and wherein the third configurable switching circuit in the second cell receives m bits of the output word delivered by the multiplier in the first cell.

22. A method according to claim 21, wherein the vertical bus, the carry propagation bus and the horizontal bus each conveys words having a number of bits at least equal to a lowest common multiple of m and of n.

23. A method according to claim 21, wherein m is equal to n, and the vertical bus, the carry propagation bus and the horizontal bus each comprises p tracks of n bits, with p being an integer greater than 1.

24. A method according to claim 20, wherein the at least one tile comprises a plurality of tiles interconnected in a quincunx form.

25. A method according to claim 24, wherein the plurality of tiles include first and second tiles in a row; further comprising connecting a sign extension module between the first and second tiles, the sign extension module being connected between the ALU in one cell in the first tile and the vertical bus of an immediately adjacent cell in the second tile.

26. A method according to claim 25, further comprising the following for each cell in the first and second tiles:
connecting a vertical bus extension to the configurable terminal switching circuit;
connecting an additional configurable terminal switching circuit to the vertical bus extension;
connecting an additional horizontal bus between the additional configurable terminal switching circuit and the additional configurable terminal switching circuit in a different cell;
connecting an additional ALU to the vertical bus extension via an additional switching circuit; and
connecting an additional carry propagation bus between the additional ALU and an additional ALU in the different cell.

27. A method according to claim 26, further comprising connecting an additional bus between the additional ALU and the ALU in an adjacent cell in a same column.

* * * * *

UNITED STATES PATENT AND TRADEMARK OFFICE
CERTIFICATE OF CORRECTION

PATENT NO. : 6,992,502 B2  Page 1 of 1
APPLICATION NO. : 10/768997
DATED : January 31, 2006
INVENTOR(S) : Cambonie It is certified that error appears in the above-identified patent and that said Letters Patent is hereby corrected as shown below:

Column 10, Line 36   Delete: "according claim"
                     Insert: --according to claim--

Column 11, Line 32   Delete: "adjacent the cell"
                     Insert: --adjacent cell--

Column 11, Line 52   Delete: "according claim"
                     Insert: --according to claim--

Signed and Sealed this

Fifth Day of June, 2007

JON W. DUDAS
*Director of the United States Patent and Trademark Office*